United States Patent
Chellamuthu et al.

(10) Patent No.: US 9,515,655 B2
(45) Date of Patent: Dec. 6, 2016

(54) MULTIPLEXING VOLTAGES ON FUNCTIONAL INPUT PIN WITH PASS DEVICE

(71) Applicant: TEXAS INSTRUMENTS INCORPORATED, Dallas, TX (US)

(72) Inventors: Shanmuganand Chellamuthu, Richardson, TX (US); Kemal Safak Demirci, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/671,436

(22) Filed: Mar. 27, 2015

(65) Prior Publication Data

US 2015/0277468 A1    Oct. 1, 2015

Related U.S. Application Data

(60) Provisional application No. 61/971,382, filed on Mar. 27, 2014.

(51) Int. Cl.
*H03K 19/003*    (2006.01)

(52) U.S. Cl.
CPC .. *H03K 19/00315* (2013.01); *H03K 19/00369* (2013.01); *Y10T 307/675* (2015.04); *Y10T 307/724* (2015.04)

(58) Field of Classification Search
CPC ............. Y10T 307/675; Y10T 307/696; Y10T 307/724
See application file for complete search history.

(56) References Cited

U.S. PATENT DOCUMENTS

| | | | | |
|---|---|---|---|---|
| 5,650,973 | A * | 7/1997 | Moyer | G11C 5/143 365/189.09 |
| 5,751,168 | A * | 5/1998 | Speed, III | H03K 19/018507 326/68 |
| 5,808,502 | A * | 9/1998 | Hui | G11C 7/1006 327/333 |
| 5,870,573 | A * | 2/1999 | Johnson | G06F 13/4022 710/107 |
| 6,114,876 | A * | 9/2000 | Kwong | H03K 19/018507 326/68 |
| 6,822,921 | B2 * | 11/2004 | Otsuka | G11C 5/147 365/189.11 |
| 6,879,191 | B2 * | 4/2005 | Davis | H03K 19/00315 326/83 |
| 7,030,659 | B2 * | 4/2006 | Graves | H03K 17/063 326/113 |

(Continued)

*Primary Examiner* — Thomas J Hiltunen
(74) *Attorney, Agent, or Firm* — Lawrence J. Bassuk; Frank D. Cimino

(57) ABSTRACT

A circuit includes an input pin connected to an integrated circuit (IC) that receives an input voltage that is provided to a first voltage circuit within the IC. A pass device having a control input responds to a first control signal state and a second control signal state. The first control signal state turns the pass device off such that the input voltage is switched off to block the passing of the input voltage to a second voltage circuit within the IC. The second control signal state turns the pass device on such that the input voltage is switched through the pass device to the second voltage circuit in a voltage range that is compatible with an input operating voltage range of the second voltage circuit.

7 Claims, 7 Drawing Sheets

(56) References Cited

U.S. PATENT DOCUMENTS

| | | | | |
|---|---|---|---|---|
| 7,042,245 B2* | 5/2006 | Hidaka | ................. | G11C 5/147 |
| | | | | 257/262 |
| 7,057,444 B2* | 6/2006 | Illegems | ................... | G05F 1/46 |
| | | | | 323/316 |
| 7,071,664 B1* | 7/2006 | Teggatz | ................ | H02J 7/0063 |
| | | | | 323/273 |
| 7,095,270 B2* | 8/2006 | Liu | ........................ | G05F 1/575 |
| | | | | 327/540 |
| 7,126,859 B2* | 10/2006 | Seki | ................ | H03K 19/00315 |
| | | | | 257/E27.062 |
| 7,652,518 B2* | 1/2010 | Takiba | ................ | G06F 13/4072 |
| | | | | 327/333 |
| 8,451,049 B2* | 5/2013 | Miyanoiri | ................. | H02J 1/10 |
| | | | | 307/80 |
| 8,526,229 B2* | 9/2013 | Takahashi | .............. | G11C 5/147 |
| | | | | 365/182 |
| 8,664,798 B2* | 3/2014 | Nozaki | .................... | H02J 1/08 |
| | | | | 307/43 |
| 8,963,618 B2* | 2/2015 | Keane | ................ | H03K 17/6872 |
| | | | | 327/434 |
| 8,981,839 B2* | 3/2015 | Kay | .................... | H03K 17/687 |
| | | | | 307/43 |
| 2003/0025130 A1* | 2/2003 | Takahashi | ................ | G11C 5/14 |
| | | | | 257/200 |
| 2008/0136384 A1* | 6/2008 | Al-Shyoukh | ............ | G05F 1/46 |
| | | | | 323/273 |
| 2012/0098514 A1* | 4/2012 | Wang | ................... | H02M 3/156 |
| | | | | 323/285 |
| 2013/0249621 A1* | 9/2013 | Gagne | ................ | H03K 17/063 |
| | | | | 327/408 |

* cited by examiner

MULTIPLEXING VOLTAGES ON FUNCTIONAL INPUT PIN WITH PASS DEVICE

CROSS-REFERENCE TO RELATED APPLICATION

This application claims the benefit of U.S. Provisional Patent Application 61/971,382 filed on Mar. 27, 2014, and entitled PVT INDEPENDENT MULTIPLEXED PIN INPUT PASS TRANSISTOR WITH OVERVOLTAGE PROTECTION, the entirety of which is incorporated by reference herein.

TECHNICAL FIELD

This disclosure relates to integrated circuits, and more particularly to a circuit providing multiplexed input pin capability to circuits that operate over different voltage ranges.

BACKGROUND

In the current integrated circuit (IC) market, the various IC chip manufacturers usually attempt to include as much functionality as possible on chip while holding the chip size as small as possible to obtain a competitive advantage. For example, multifunctional IC's are often provided to help users reduce their respective design cycle and cost. However, as multifunctional chips are developed, the number of pins on the IC package typically increases with the increased functionality implemented on the chip. As a result of increased pin count, the size of the chip increases, which results in higher fabrication costs among other complexities. One possible technique to mitigate this problem is to employ pins that can be shared non-concurrently by two or more circuit blocks within the integrated circuit. However, if the two or more circuit blocks operate according to different input operating ranges and supply voltages, then such sharing is not possible via conventional circuit topologies.

SUMMARY

This disclosure relates to a circuit providing multiplexed input pin capability to circuits that operate over different voltage ranges. In one aspect, a circuit includes an input pin connected to an integrated circuit (IC) that receives an input voltage that is provided to a first voltage circuit within the IC. A pass device having a control input responds to a first control signal state and a second control signal state. The first control signal state turns the pass device off such that the input voltage is switched off to block the passing of the input voltage to a second voltage circuit within the IC. The second control signal state turns the pass device on such that the input voltage is switched through the pass device to the second voltage circuit in a voltage range that is compatible with an input operating voltage range of the second voltage circuit.

In another aspect, a circuit includes an input pin connected to an integrated circuit (IC) that receives an input voltage that is provided to a first voltage circuit within the IC. A pass device having a control input responds to a first control signal state and a second control signal state. The first control signal state turns the pass device off such that the input voltage is switched off to block the passing of the input voltage to a second voltage circuit within the IC. The second control signal state turns the pass device on such that the input voltage is switched through the pass device to the second voltage circuit in a voltage range that is compatible with an input operating voltage range of the second voltage circuit. A control circuit switches a drive signal to the control input of the pass device based on an enable signal. The enable signal controls switching of the control input from the first control signal state to the second control signal state. A regulator provides a voltage level to the drive signal to control the operating range of the pass device in the second control signal state.

In yet another aspect, a circuit includes an input pin connected to an integrated circuit (IC) that receives an input voltage that is provided to a first voltage circuit within the IC. A first pass device having a control input responds to a first control signal state and a second control signal state. The first control signal state turns the first pass device off such that the input voltage is switched off to block the passing of the input voltage to a second voltage circuit within the IC. The second control signal state turns the first pass device on such that the input voltage is switched through the first pass device to the second voltage circuit in a voltage range that is compatible with an input operating voltage range of the second voltage circuit. A second pass device having a second control input responds to a third control signal state and a fourth control signal state. The third control signal state turns the second pass device off such that the input voltage is switched off to block the passing of the input voltage to a third voltage circuit within the IC. The fourth control signal state turns the second pass device on such that the input voltage is switched through the second pass device to the third voltage circuit in a voltage range that is compatible with an input operating voltage range of the third voltage circuit. A first control circuit switches a first drive signal to the control input of the first pass device based on a first enable signal. The first enable signal controls switching of the control input from the first control signal state to the second control signal state. A second control circuit switches a second drive signal to the control input of the second pass device based on a second enable signal. The second enable signal controls switching of the control input from the third control signal state to the fourth control signal state. A regulator provides a voltage level to the first drive signal and the second drive signal to control the operating range of the first pass device in the second control state and the operating range of the second pass device in the fourth control signal state.

DETAILED DESCRIPTION

This disclosure relates to a circuit providing multiplexed input pin capability to circuits that operate over different voltage ranges. Input pin multiplexing is provided for integrated circuits (IC) where a single input pin in the IC can be utilized to provide input to more than one circuit in the IC even though the different circuits operate over different voltage ranges. For example, one circuit may operate according to a high voltage range (e.g., 0-10 v) and another circuit may operate over a low voltage range (e.g., 0-5 v) where switching and control circuitry inside the IC allow a single input pin to be multiplexed to provide input to each circuit that is compatible with its respective operating range. Temperature and tracking capabilities are also provided within the switching and control circuitry to allow the input voltage range to be automatically adjusted as environmental conditions change.

The circuit includes an input pin connected to an integrated circuit (IC) that receives an input voltage that is provided to a first voltage circuit within the IC, where the first voltage circuit could be a high or low voltage circuit, for example. A pass device having a control input is utilized to pass or block the input voltage from reaching one of the IC circuits based on the control input which responds to a first control signal state and a second control signal state to control multiplexing of the pin. The first control signal state turns the pass device off such that the input voltage is switched off to block the passing of the input voltage to a second voltage circuit within the IC. The second control signal state turns the pass device on such that the input voltage is switched through the pass device to the second voltage circuit in a voltage range that is compatible with an input operating voltage range of the second voltage circuit. In some examples, the first voltage circuit can be a high voltage circuit and the second voltage circuit can be a low voltage circuit, where the pass device operates to clamp high voltages provided to the second voltage circuit in response to the control input. In other configurations, the first voltage circuit can be a low voltage circuit and the second voltage circuit can be a high voltage circuit, where the pass device operates to boost low voltages provided to the second voltage circuit in response to the control input.

Figure 1:
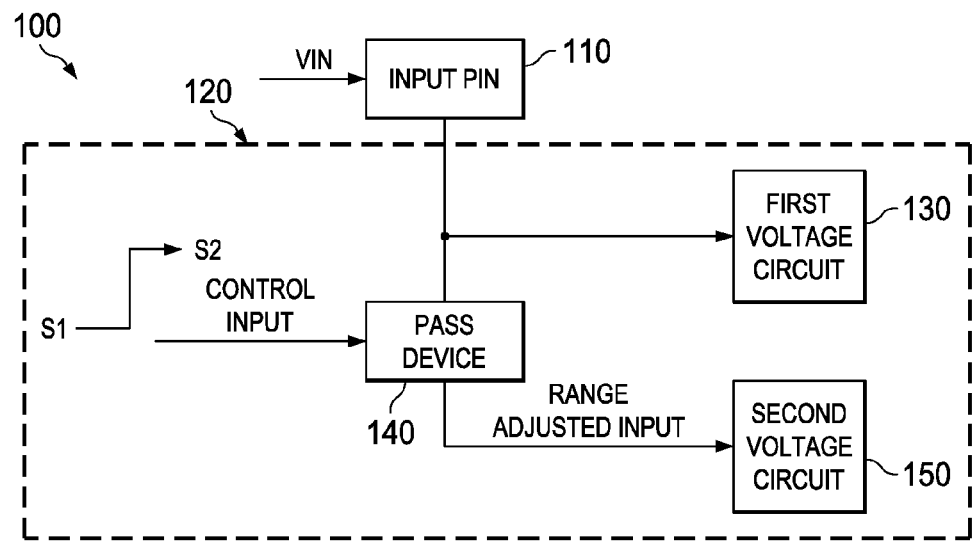
FIG. 1 illustrates an example of a circuit providing multiplexed input pin capability to circuits within an integrated circuit (IC) that operate over different voltage ranges.

FIG. 1 illustrates an example of an integrated circuit (IC) 100 providing multiplexed input pin capability to circuits within the IC that operate over different voltage ranges. As used herein, the term circuit can include a collection of active and/or passive elements that perform a circuit function such as an analog circuit or control circuit, for example. The term circuit can also include an integrated circuit where all the circuit elements are fabricated on a common substrate, for example. The circuit 100 includes an input pin 110 connected to an integrated circuit (IC) 120 that receives an input voltage (VIN) that is provided to a first voltage circuit 130 within the IC. The first voltage circuit 130 could be a high or low voltage circuit, for example, where high or low refers to the operating range of the circuit. As used herein, operating range refers to the minimum and maximum voltages that a circuit can reliably operate without degradation due to voltages being applied outside the intended range. A pass device 140 (e.g., transistor, series transistor pair) having a control input is utilized to pass or block the input voltage VIN from reaching a second voltage circuit 150 based on the control input which responds to a first control signal state shown as S1 and a second control signal state S2 to control multiplexing of the input pin 110.

The first control signal state S1 turns the pass device 140 off such that the input voltage VIN is switched off to block the passing of the input voltage to the second voltage circuit 150 within the IC 120. The second control signal state S2 turns the pass device 140 on such that the input voltage VIN is switched through the pass device to the second voltage circuit 150 in a voltage range that is compatible with an input operating voltage range of the second voltage circuit. The control input of the pass device 140, can control the pass device as full off, full on, or somewhere in a linear region between full off and full on depending on the voltage level supplied to the control input as will be illustrated and described below with respect to FIG. 2.

In some examples, the first voltage circuit 130 can be a high voltage circuit and the second voltage circuit 150 can be a low voltage circuit, where the pass device 140 operates to clamp high voltages provided to the second voltage circuit in response to the control input. In other configurations, the first voltage circuit 130 can be a low voltage circuit and the second voltage circuit 150 can be a high voltage circuit, where the pass device 140 operates to boost low voltages provided to the second voltage circuit in response to the control input. As will be described below with respect to FIGS. 2 and 3, temperature and tracking capabilities are also provided within the IC 120 to allow the input voltage range to be automatically adjusted as environmental conditions change.

Figure 2:
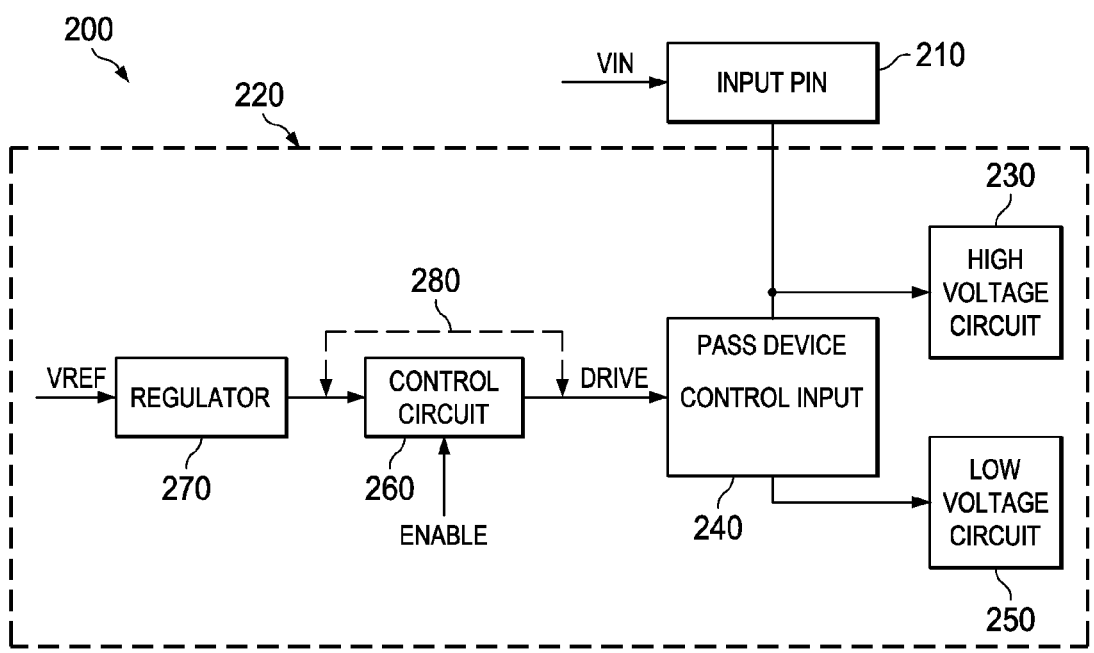
FIG. 2 illustrates an example block diagram of a circuit providing multiplexed input pin capability to circuits within an integrated circuit (IC) that operate over different voltage ranges where a control circuit and regulator are employed to control multiplexing of the input pin.

FIG. 2 illustrates an example block diagram of a circuit 200 providing multiplexed input pin capability to circuits within an integrated circuit (IC) that operate over different voltage ranges where a control circuit and regulator are employed to control multiplexing of an input pin. The circuit 200 includes an input pin 210 connected to an integrated circuit (IC) 220 that receives an input voltage (VIN) that is provided to a high voltage circuit 230 within the IC. A pass device 240 having a control input responds to a first control signal state and a second control signal state such as states S1 and S2 illustrated above with respect to FIG. 1. The first control signal state turns the pass device 240 off such that the input voltage VIN is switched off to block the passing of the input voltage to a low voltage circuit 250 within the IC. The second control signal state turns the pass device 240 on such that the input voltage VIN is switched through the pass device to the low voltage circuit in a voltage range that is compatible with an input operating voltage range of the second voltage circuit 250. For example, if the high voltage circuit 230 operated in a 0 to 20 volt range and the low voltage circuit operated in a 0 to 5 volt range, and if the input signal VIN was driven in the 0 to 20 volt range, then the voltage switched through the pass device 240 during the second control signal state would be in the range of about 0 to 5 volts to be compatible with the range of the low voltage circuit 250.

In one example, a control circuit 260 can be provided that switches a drive signal to the control input of the pass device 240 based on an enable signal shown as ENABLE. The enable signal controls switching of the control input from the first control signal state to the second control signal state. A regulator 270 provides a voltage level to the drive signal to control the operating range of the pass device in the second control signal state. For example, the voltage level output of the regulator 270 sets the threshold voltage for the pass device 240. In an alternative control example for the circuit 200, the control circuit can be eliminated and the regulator 270 can drive the pass device 240 directly as shown via line 280. As shown, the regulator 270 includes a voltage reference input (VREF) to set the value of its output voltage which can be supplied directly to the pass device 240 to drive the control input. In this example, the voltage reference VREF can be varied between a minimum and a maximum voltage to generate the first and second control signal states (e.g., S1 is off when VREF is zero and S2 is on when VREF equals VREF).

As will be shown in more detail below with respect to FIGS. 3-8, the regulator 270 includes an output drive transistor that is substantially matched to the parametric characteristics of the pass device 240 in the IC 220 such that the drive signal (supplied directly or switched) to the control input tracks temperature and process variations of a threshold voltage associated with the control input of the pass device. Other circuit examples that will be illustrated and described below with respect to FIGS. 3-8 include providing a second pass device (See e.g., FIG. 4) having a second control input that responds to a third control signal state and a fourth control signal state. The third control signal state turns the second pass device off such that the input voltage is switched off to block the passing of the input voltage VIN to a third voltage circuit within the IC. The fourth control signal state turns the second pass device on such that the input voltage is switched through the second pass device to the third voltage circuit in a voltage range that is compatible with an input operating voltage range of the third voltage circuit. A second control circuit can be provided to switch a second drive signal to the control input of the second pass device based on a second enable signal, where the second enable signal controls switching of the control input from the third control signal state to the fourth control signal state. In yet another circuit example, a second regulator can be provided to provide a voltage level for the second drive signal.

In some examples the pass device can be a single transistor that is operated non-linearly (e.g., full off/on) or in the linear region depending on the output voltage level set by the regulator 270 and applied to the control input. In another example, the pass device 240 can be configured as a first transistor and a second transistor coupled in series. The first transistor turns on during the second control signal state such that the input voltage is switched through the first transistor to the second voltage circuit in a voltage range that is compatible with an input operating voltage range of the second voltage circuit. The second transistor is turned on to provide a ground path for second voltage circuit during the first signal state.

Figure 3:
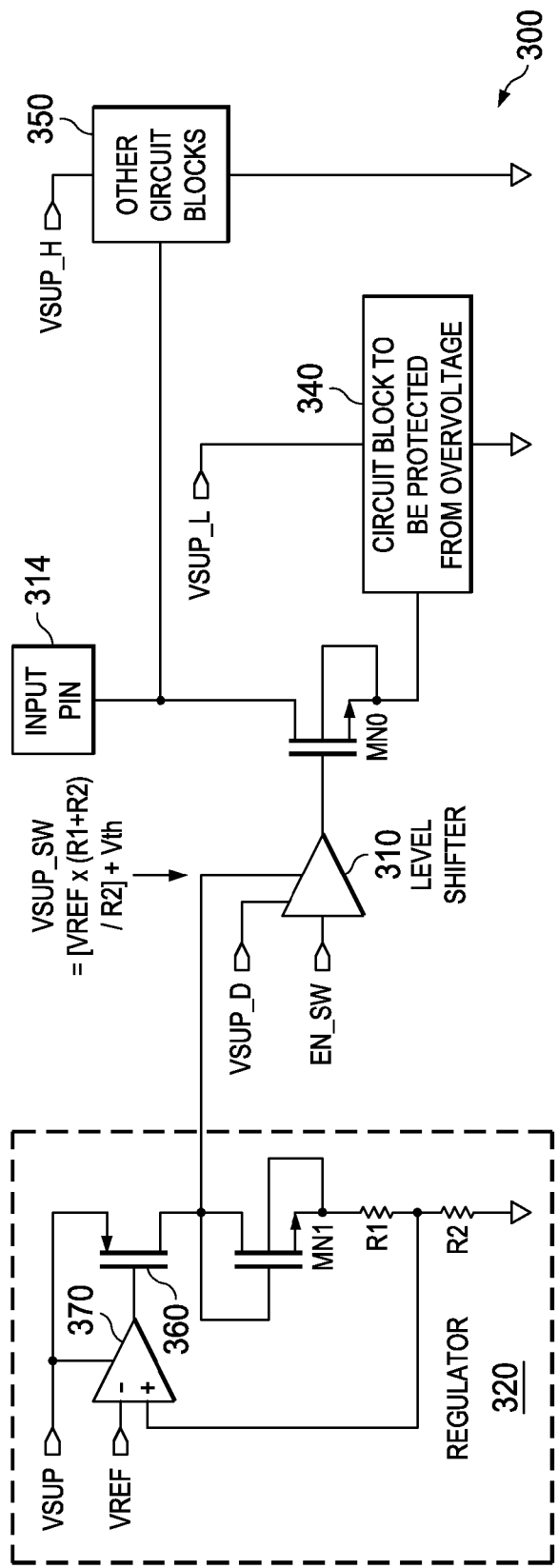
FIG. 3 illustrates a circuit implementation example of an integrated circuit (IC) providing multiplexed input pin capability to circuits within the IC that operate over different voltage ranges where a level shifter and regulator are employed to control multiplexing of the input pin.

FIG. 3 illustrates a circuit implementation example of an integrated circuit (IC) 300 providing multiplexed input pin capability to circuits within the IC that operate over different voltage ranges where a level shifter 310 and regulator 320 are employed to control multiplexing of an input pin 314. In this example, the control circuit described above is shown as a level shifter that is turned off and on via enable signal EN-SW. When enabled, the level shifter passes the output voltage supplied by the regulator 320 to pass device MN0 which is connected to a low voltage circuit 340 operated off a low voltage supply (VSUP_L). The input pin 314 can drive one or more high voltage circuits 350 directly which operate off high voltage supply (VSUP_H). In this example, MN0 can be provided as a process-variation and temperature (PVT) independent NMOS pass transistor to the multiplexed input pin 314 for overvoltage protection of the circuits 340 running from the low-voltage supply VSUP_L. To turn-off the pass transistor, about 0V is applied to the gate of MN0. The pass transistor MN0 is enabled by applying drive signal (VSUP_SW) at its gate.

The drive signal VSUP_SW is generated using the regulator 320 (e.g., can be linear or switching regulator) that incorporates an NMOS transistor MN1 matched with the input pass transistor MN0 in the feedback network of the regulator. In this manner, VSUP_SW tracks the temperature and process dependent variations in the threshold voltage of the input pass transistor MN0. Since an NMOS transistor passes voltage levels one threshold voltage below its gate voltage, the input pass transistor passes voltages below the level set by the reference voltage (VREF) and the ratio of the resistors (R1 and R2) in the feedback network of the regulator 320. The drive signal VSUP_SW is applied to the input pass transistor MN0 through the level shifter 310 that is enabled or disabled with the control signal EN_SW which can be supplied from digital logic, for example. The input pass transistor MN0 has its operating parameters selected such that it can handle voltage levels applied to the input pin 314 without degradation. As shown, the regulator 320 can also include feedback transistor 360 and amplifier 370 which can operate on its own supply shown as (VSUP). In this example, the level shifter 310 can also operate off its own supply (e.g., digital supply shown as VSUP_D).

Figure 4:
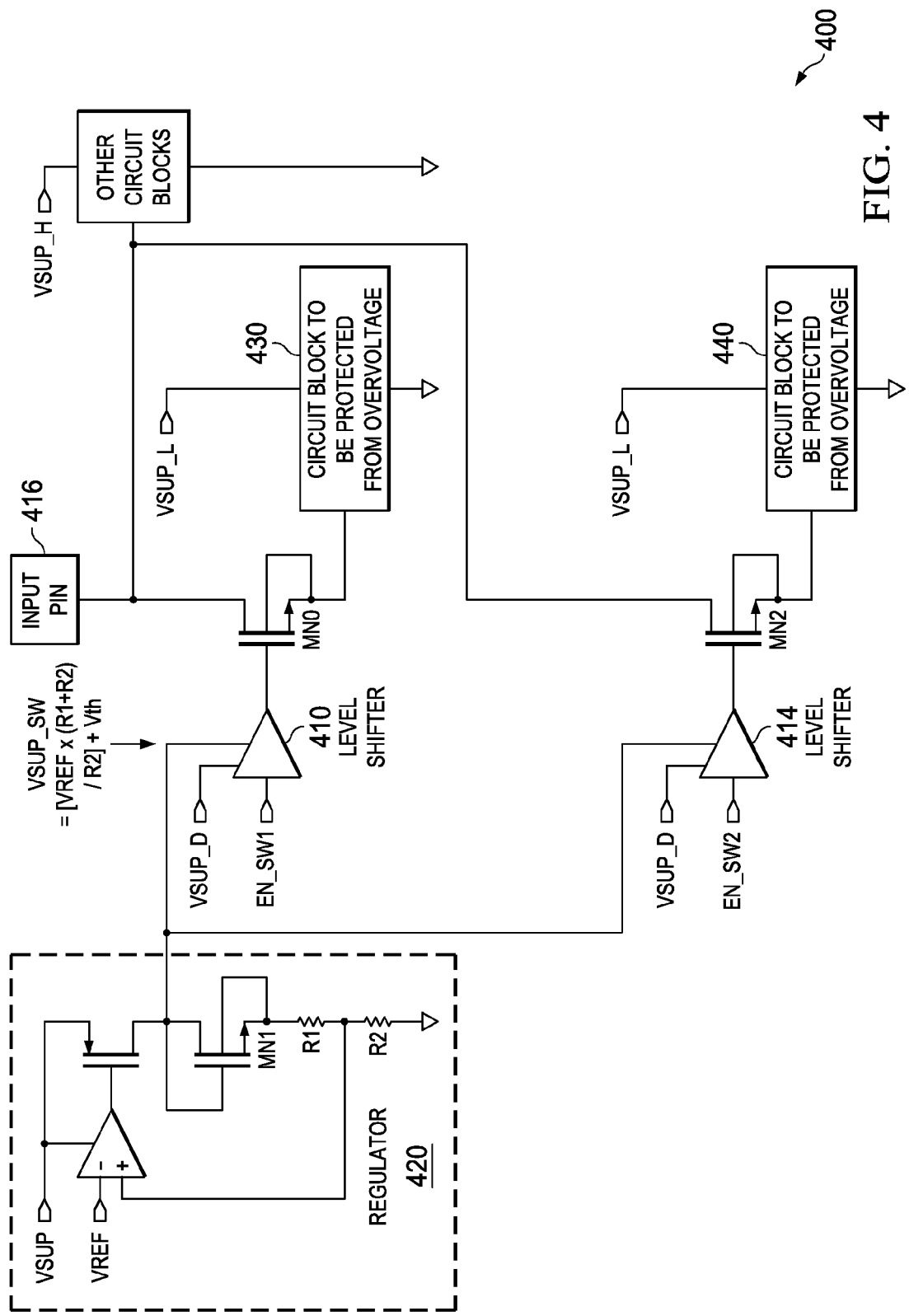
FIG. 4 illustrates a circuit implementation example of an integrated circuit (IC) providing multiplexed input pin capability to circuits within the IC that operate over different voltage ranges where multiple level shifters and a regulator are employed to control multiplexing of the input pin to additional circuits within the IC.
Figure 5:
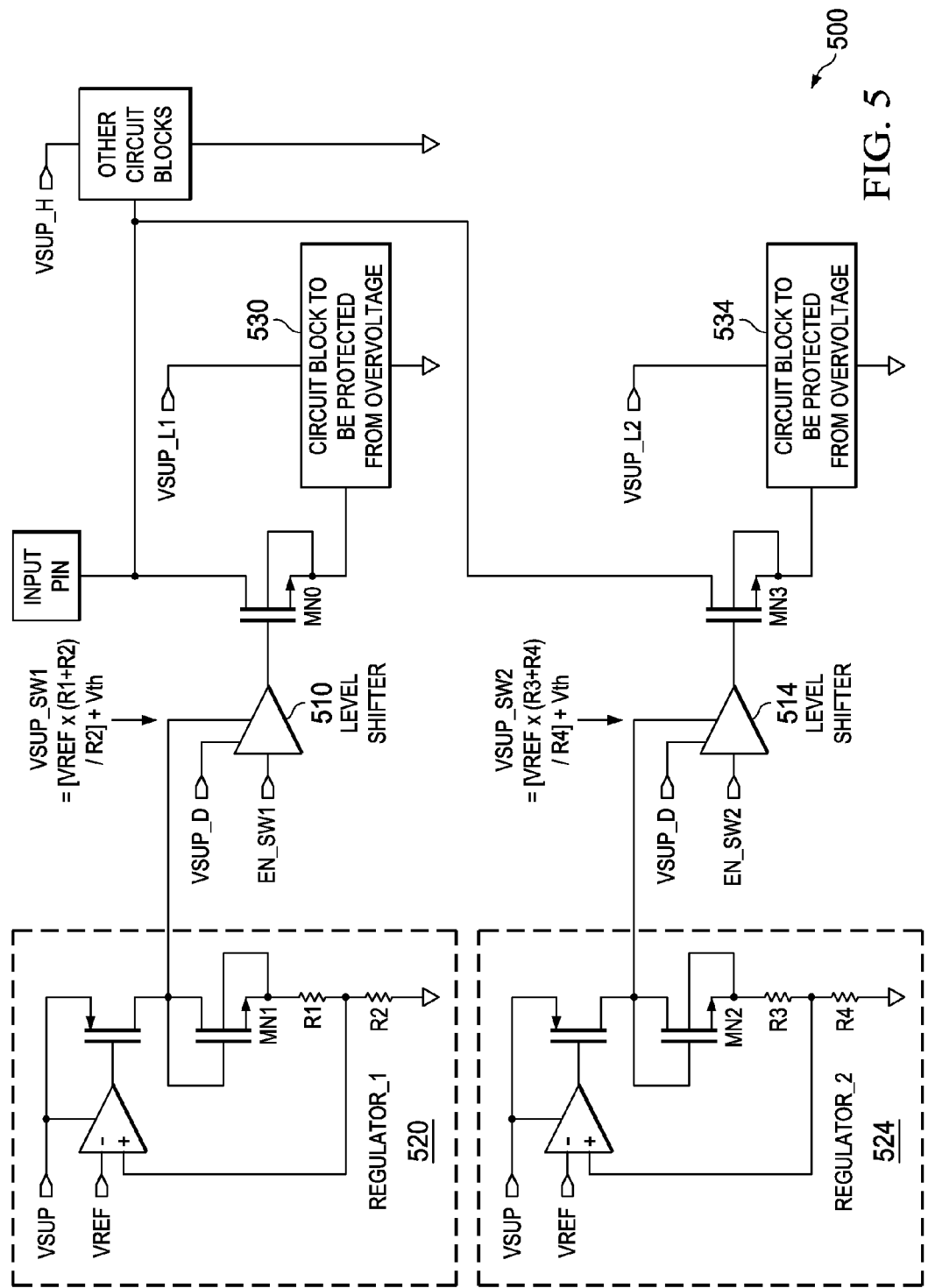
FIG. 5 illustrates a circuit implementation example of an integrated circuit (IC) providing multiplexed input pin capability to circuits within the IC that operate over different voltage ranges where multiple level shifters and multiple regulators are employed to control multiplexing of the input pin to additional circuits within the IC.

FIGS. 4-9 will now illustrate various examples of the circuit 300. As such, for purposes of brevity, the discussion will focus on the differences with respect to FIG. 3 rather than individual circuit elements that are in common between the figures. FIG. 4 illustrates a circuit implementation example of an integrated circuit (IC) 400 providing multiplexed input pin capability to circuits within the IC that operate over different voltage ranges where multiple level shifters 410 and 414 and a regulator 420 are employed to control multiplexing of an input pin 416 to additional circuits within the IC. In this example, the regulator 420 drives the level shifters 410 and 414 to provide additional input pin multiplexing capability. Here, additional circuits 430 and 440 can receive input from the input pin 416 via first pass transistor MN0 and second pass transistor MN2. The circuits 430 and 440 can operate off the same supply voltage VSUP_L in this example. If different supply voltages are needed for the circuits 430 and 440, a second regulator can be added such as shown in FIG. 5.

FIG. 5 illustrates a circuit implementation example of an integrated circuit (IC) 500 providing multiplexed input pin capability to circuits within the IC that operate over different voltage ranges where multiple level shifters 510 and 514 and multiple regulators 520 and 524 are employed to control multiplexing of the input pin to additional circuits within the IC. In this example, a circuit at 530 and 534 operate off different supply voltages shown as VSUP_L1 and VSUP_L2. Thus, each level shifter can receive a different regulated voltage from the regulators 520 and 524 in order to support the operating range of the respective circuits 530 and 534.

Figure 6:
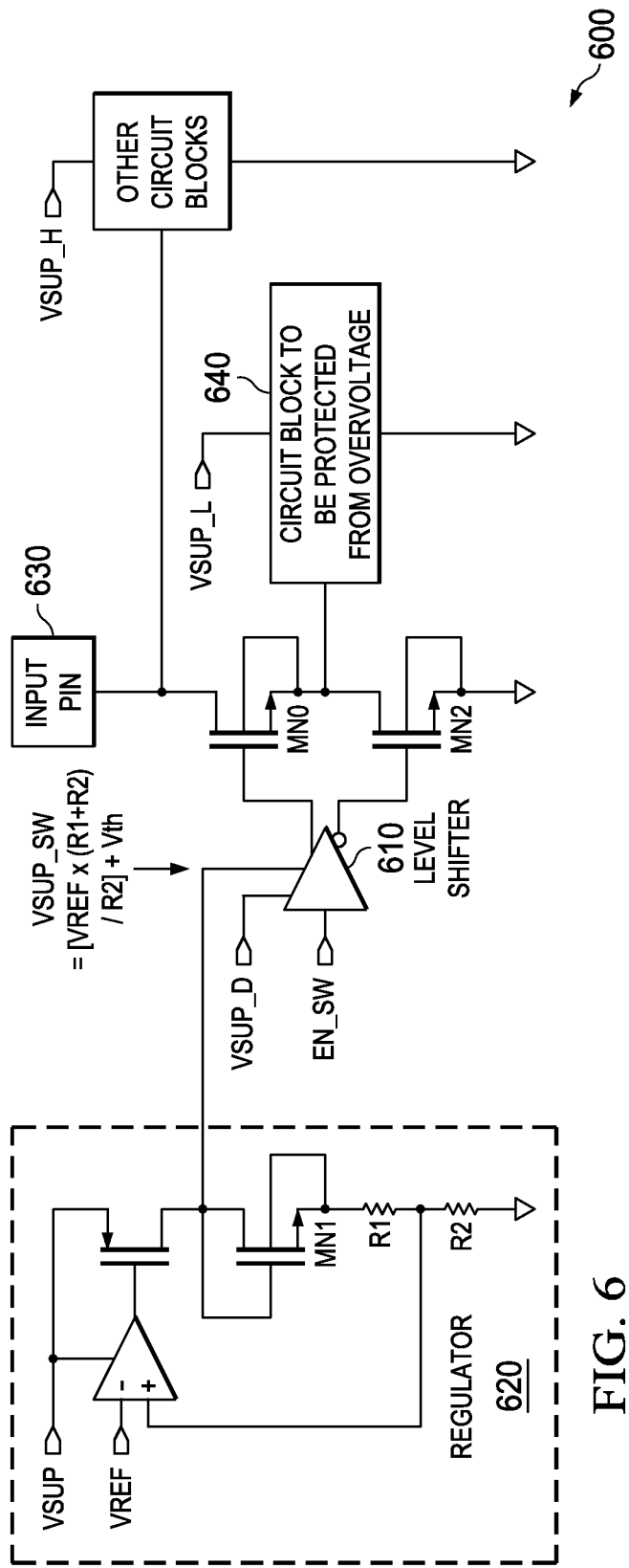
FIG. 6 illustrates a circuit implementation example of an integrated circuit (IC) providing multiplexed input pin capability to circuits within the IC that operate over different voltage ranges where a level shifter having a differential output and regulator are employed to control multiplexing of the input pin.

FIG. 6 illustrates a circuit implementation example of an integrated circuit (IC) 600 providing multiplexed input pin capability to circuits within the IC that operate over different voltage ranges where a level shifter 610 having a differential output and regulator 620 are employed to control multiplexing of an input pin 630. In this example, pass transistors MN0 and MN2 can be provided where MN0 passes the input voltage to a circuit 640 when the level shifter 610 is enabled via signal EN_SW. When the level shifter 610 is disabled, MN0 is turned off blocking the input 630 form the circuit 640. At about the same time, MN2 is enabled which actively pulls down the input to the circuit 640 when the level shifter is disabled.

Figure 7:
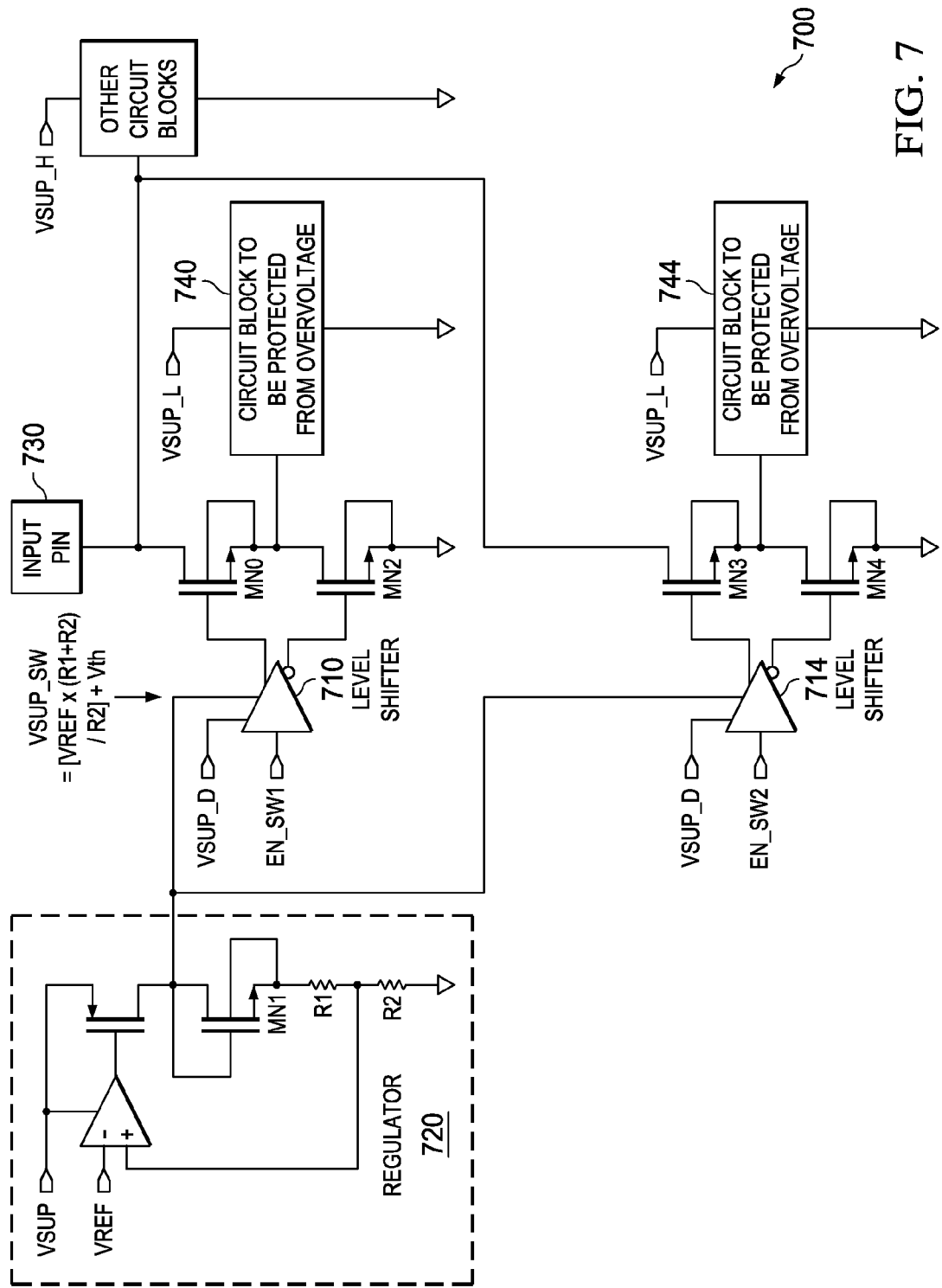
FIG. 7 illustrates a circuit implementation example of an integrated circuit (IC) providing multiplexed input pin capability to circuits within the IC that operate over different voltage ranges where multiple level shifters having differential output and a regulator are employed to control multiplexing of the input pin to additional circuits within the IC.

FIG. 7 illustrates a circuit implementation example of an integrated circuit (IC) 700 providing multiplexed input pin capability to circuits within the IC that operate over different voltage ranges where multiple level shifters 710 and 714 having differential output and a regulator 720 are employed to control multiplexing of an input pin 730 to additional circuits 740 and 744 within the IC. The circuit 700 is similar to the circuit previously described with respect to FIG. 4 except in this example, output from each level shifter 710 and 714 drives a pair of series coupled pass transistors which provide pull down capability for the circuits 740 and 744 when the level shifters are turned off.

Figure 8:
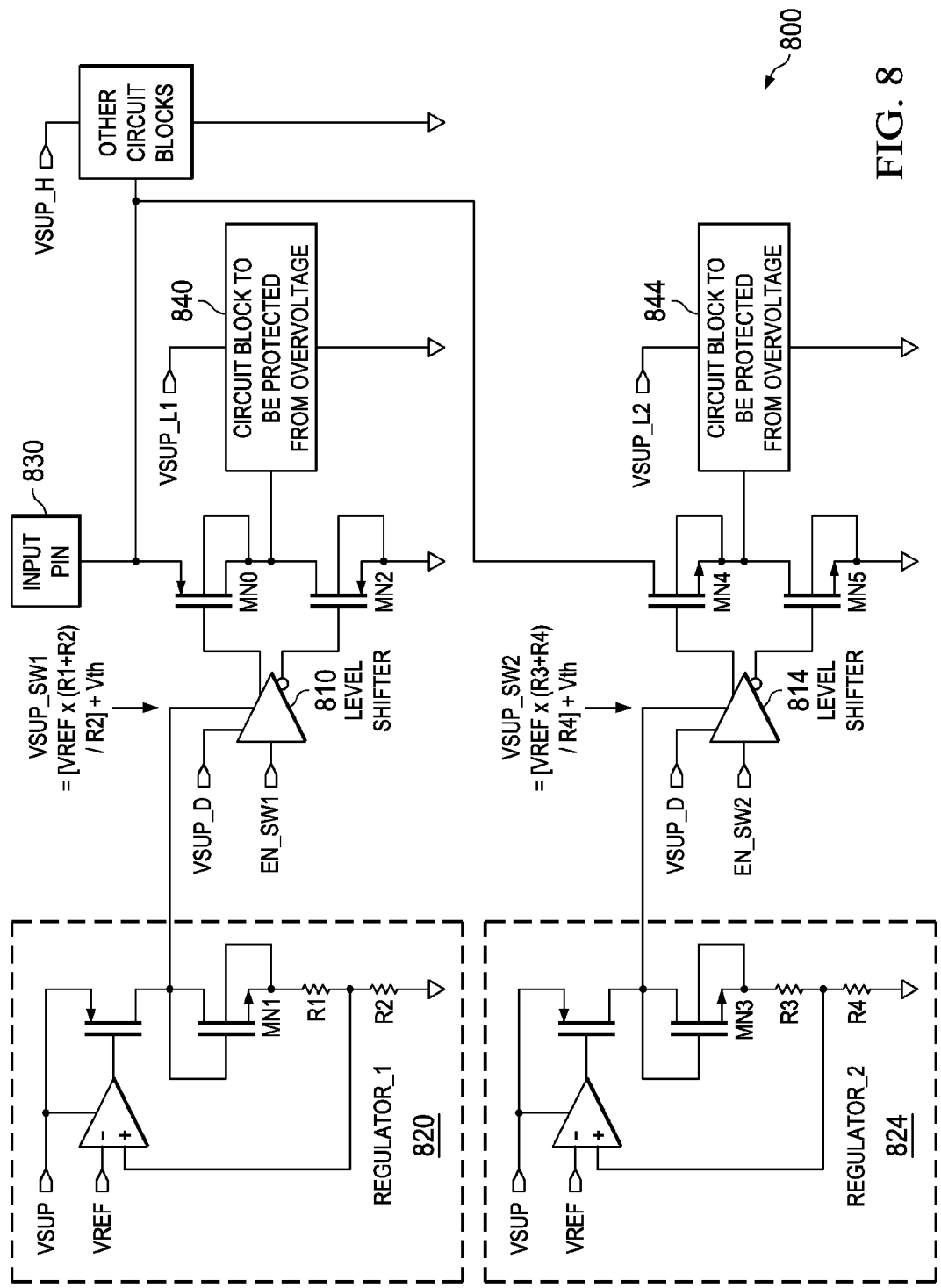
FIG. 8 illustrates a circuit implementation example of an integrated circuit (IC) providing multiplexed input pin capability to circuits within the IC that operate over different voltage ranges where multiple level shifters having differential output and multiple regulators are employed to control multiplexing of the input pin to additional circuits within the IC.

FIG. 8 illustrates a circuit implementation example of an integrated circuit (IC) 800 providing multiplexed input pin capability to circuits within the IC that operate over different voltage ranges where multiple level shifters 810 and 814 having differential output and multiple regulators 820 and 824 are employed to control multiplexing of an input pin 830 to additional circuits 840 and 844 within the IC. Similar to the example described above with respect to FIG. 5, the circuit 800 provides an additional regulator since the circuits 840 and 844 operate from different supply voltages.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. An integrated circuit comprising:
   (a) a functional input pin;
   (b) a first circuit block, operating at a first voltage, having a functional input directly connected to the functional input pin;
   (c) a second circuit block, operating at a second voltage different than the first voltage, having a functional input coupled to the functional input pin;
   (d) a first pass device having an input directly connected to the functional input pin, an output directly connected to the functional input of the second circuit block, and a control input, the first pass device selectively coupling the functional input pin to the second circuit block;
   (e) a first regulator circuit having a VREF input and a first regulated voltage output; and
   (f) a first control circuit having a regulated voltage input coupled to the first regulated voltage output, a drive output coupled to the control input of the first pass device, and an enable input.

2. The integrated circuit of claim 1 in which the first voltage is higher than the second voltage.

3. The integrated circuit of claim 1 in which the first pass device is a transistor.

4. The integrated circuit of claim 1 in which the functional input pin is multiplexed to receive a signal at the first voltage at one time and receives a signal at the second voltage at another time, and the control input to the first pass device operates in a first control state for the one time and a second control state for the another time, the first pass device selectively coupling the functional input pin to the second circuit block during the second time.

5. The integrated circuit of claim 1 including a third circuit block, operating at a third voltage different than the first voltage, having a functional input coupled to the functional input pin, and a second pass device having an input directly connected to the functional input pin, an output directly connected to the functional input of the third circuit block, and a control input, the first pass device selectively coupling the functional input pin to the second circuit block, and the second pass device selectively coupling the functional input pin to the third circuit block.

6. The integrated circuit of claim 1 including a third circuit block, operating at a third voltage different than the first voltage, having a functional input coupled to the functional input pin, a second pass device having an input directly connected to the functional input pin, an output directly connected to the functional input of the third circuit block, and a control input, and the first regulator circuitry having the first regulated output coupled to the control input of the second pass device.

7. The integrated circuit of claim 1 in which the pass device includes first and second transistors connected in series between the functional input pin and a voltage ground and the output of the pass device is connected to between the two transistors.

* * * * *